(12) United States Patent
Mühlberger et al.

(10) Patent No.: US 6,275,043 B1
(45) Date of Patent: Aug. 14, 2001

(54) TEST DEVICE FOR TESTING A MODULE FOR A DATA CARRIER INTENDED FOR CONTACTLESS COMMUNICATION

(75) Inventors: Andreas Mühlberger, Graz; Johann Vorreiter, Semriach, both of (AT)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/376,863

(22) Filed: Aug. 18, 1999

(30) Foreign Application Priority Data

Aug. 21, 1998 (EP) .................................. 98890248

(51) Int. Cl.[7] .......................... G01R 31/00; G08C 15/08; H04Q 5/22

(52) U.S. Cl. ........................ 324/500; 340/10.1; 340/10.4; 340/10.42; 340/870.31

(58) Field of Search ........................... 324/500; 340/10.1, 340/10.4, 10.42, 870.31

(56) References Cited

U.S. PATENT DOCUMENTS

| | | | |
|---|---|---|---|
| 5,345,231 | 9/1994 | Koo et al. ....................... | 340/870.31 |
| 6,028,503 * | 2/2000 | Preishuberpflugl et al. ....... | 340/10.4 |
| 6,091,342 * | 7/2000 | Janesch et al. ..................... | 340/10.1 |
| 6,097,278 * | 8/2000 | Arnold et al. ..................... | 340/10.1 |
| 6,112,275 * | 8/2000 | Curry et al. ......................... | 711/100 |

FOREIGN PATENT DOCUMENTS

0845751A1   6/1998   (EP) ............................... G06K/7/08

* cited by examiner

Primary Examiner—Glenn W. Brown
Assistant Examiner—Wasseem H. Hamdan

(57) ABSTRACT

A test device (1) for testing a module (2) for a data carrier intended for contactless communication includes a carrier signal generator (14) which is arranged to generate a carrier signal (CS) whereby a test signal (TS) can be generated, a conductive connection being provided between the carrier signal generator (14) and a module (2) to be tested, which connection includes an impedance (31), preferably being a series resistor (31), which is connected directly ahead of a module terminal (5) of the module (2) to be tested, the test device (1) being provided with at least one detection device (34, 35) for determining an analog characteristic value (C, m) of a module (2) to be tested while utilizing the test signal (TS) appearing on an impedance terminal (32) of the impedance (31).

13 Claims, 3 Drawing Sheets

TEST DEVICE FOR TESTING A MODULE FOR A DATA CARRIER INTENDED FOR CONTACTLESS COMMUNICATION

BACKGROUND OF THE INVENTION

1. Field of the Invention

The invention relates to a test device which is arranged to carry out at least one test operation on a module which is constructed for use in conjunction with a data carrier intended for contactless communication and includes an integrated component, two module terminals for connection to two transmission means terminals, two test terminals, each of which can be brought into contact with a module terminal of a module to be tested, is provided with a carrier signal generator whereby a carrier signal can be generated, and includes a signal path which is situated between the carrier signal generator and at least one test terminal and via which a test signal, corresponding to a carrier signal output by the carrier signal generator, can be applied to the at least one test terminal, the load modulation means which are included in the integrated component of the module to be tested being capable of load modulating the test signal when module terminals of a module to be tested are in contact with the test terminals.

The invention further relates to a method of manufacturing a module according to the preamble of Claim 6.

2. Related Art

A test device of the kind set forth in the first paragraph was developed and marketed by applicant so that it is known. The known test device essentially consists of a test station, which includes the carrier signal generator, of a first transmission coil which is conductively connected to the test station, and of a second transmission coil which is inductively coupled to the first transmission coil but is not conductively connected thereto, the coil ends of said second transmission coil being connected to two test terminals of the test device via comparatively long leads. Thus, in the signal path between the carrier signal generator and the test terminals in the known test device there are inserted two transmission coils which are only inductively coupled to one another in order to apply the test signal, corresponding to the carrier signal generated by the carrier signal generator, to the test terminals so that no conductive connection is provided between the carrier signal generator and the test terminals. Consequently, the known test device is suitable only for testing the digital functionality of a module only, i.e. for testing whether digital data can be correctly transmitted from a module to the test device. A test of this kind may yield a positive result, even though other important analog characteristic values of a module do not lie within a range required for correct operation of such a module; consequently, faults could occur during operation after incorporation of such a module in a data carrier or it may be that correct operation cannot be achieved. The known test device, therefore, offers only limited possibilities for testing.

SUMMARY OF THE INVENTION

It is an object of the invention to mitigate or even eliminate the described limitations and problems and to realize an improved test device which offers significantly enhanced possibilities for testing. It is a further object of the invention to improve the method according to preamble of Claim 6 in order to enhance the certainty that the modules manufactured by the improved method do not include disadvantageous faults. In order to achieve this object, a test device of the kind set forth in the first paragraph according to the invention is characterized in that the signal path is constructed so as to be conductive, that an impedance is included in the signal path, directly ahead of at least one test terminal, and that at least one detection device is connected to at least one test terminal, which detection device is arranged to determine, while utilizing the test signal that can be applied to the at least one test terminal, an analog characteristic value of a module to be tested which is in contact with the test terminals by way of its module terminals.

In order to achieve the afore mentioned object, a method according to the preamble of Claim 6 is characterized according to the invention as disclosed in the characterizing part of Claim 6.

Using only comparatively few additional means, the steps according to the invention simply ensure that not only the digital functionality of a module can be tested, i.e. the correct operation of the logic section, the digital section and the storage section of a module, but also at least one particularly important analog characteristic value of a module. The testing of the functionality of a module is so important because the knowing that the functionality of a module is correct prior to building into or use in a data carrier is important because the faulty module can then be rejected in the case of a negative test result, thus avoiding the production of a faulty data carrier.

It has been found that for a test device and a method according to the invention it is very advantageous to take also the steps disclosed in Claim 2 and Claim 6, respectively. The testing of the input capacitance of a module constitutes a particularly important step during the testing of the correct functionality of a module because, after the building in of a module into a data carrier, the input capacitance of a module forms a parallel resonant circuit, for example in conjunction with a data carrier transmission coil and the resonance frequency of said circuit has to lie in an exactly defined frequency range so as to ensure optimum data transmission.

A particularly simple and reliable embodiment of a test device and a method have the characteristics disclosed in Claim 3 and Claim 8 respectively.

It has also proved to be very advantageous when additionally the steps disclosed in Claim 4 and Claim 9, respectively, are taken to a test device and a method according to the invention. The testing of the modulation index that can be achieved by means of a module during load modulation also constitutes a very important step for the testing of the correct functionality of a module. This is because error-free and perfect data transmission is not ensured when the modulation index is too low whereas the load modulation means could cause excessive power consumption in a data carrier in the case of a modulation index which is too high; this is an important aspect notably in the case of so-called passive data carriers because such passive data carriers derive the required power from the carrier signal transmitted to such a data carrier.

The foregoing and further aspects of the invention will become apparent from the embodiment which is described hereinafter.

BRIEF DESCRIPTION OF THE DRAWINGS

The invention will be described in detail hereinafter on the basis of an embodiment as shown in the drawings, however, without the invention being restricted thereto.

Figure 1:
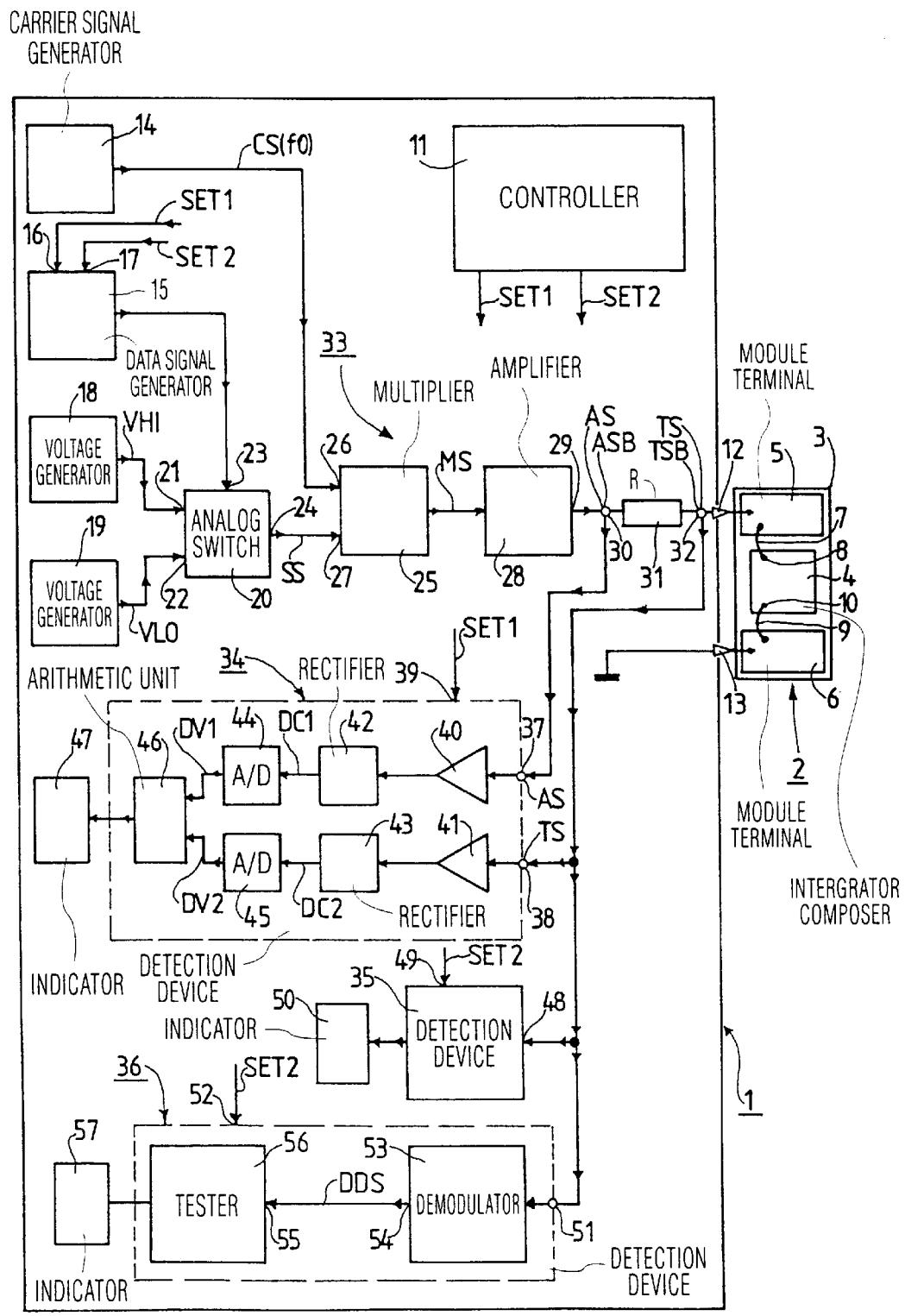
FIG. 1 shows a block diagram of an in this context essential part of an embodiment of a test device according to the invention.

The FIGS. 2A to 2G show the waveforms of signals which occur in the test device of FIG. 1 during the execution of a test operation for determining the value of the input capacitance of a module to be tested.

The FIGS. 3A to 3F show the waveforms of signals which occur in the test device of FIG. 1 during the execution of a test operation for determining the modulation index which is produced by the load modulation of a test signal, output by the test device, by means of the load modulation means of a module to be tested, and for determining correct data transmission to and from a module to be tested.

DETAILED DESCRIPTION OF THE INVENTION

FIG. 1 shows a block diagram of a first embodiment of a test device 1 according to the invention. The test device 1 is arranged to carry out at least one test operation on a module 2; it can carry out two test operations in the present case.

The module 2 is constructed for use in a data carrier which is intended for contactless communication but is not shown in FIG. 1. Such a data carrier includes a module 2 and additionally transmission means for contactless communication with a write/read station. The transmission means may be operative in a capacitive fashion, but are preferably constructed by means of inductively operative transmission coils. Such a transmission coil has two coil terminals which are intended to be connected to two module terminals of a module 2.

The module 2 of FIG. 1 includes a substrate 3 whereto there is connected an integrated component (IC) 4 and is provided with two module terminals, that is to say a first module terminal 5 and a second module terminal 6. The first module terminal 5 is connected to a first IC terminal 8, via a first electrically conductive connection 7, and the second module terminal 6 is connected, via a second electrically conductive connection 9, to a second IC terminal 10.

The integrated component 4 includes (not shown) load modulation means whereby a non-modulated carrier signal, applied to the integrated component 4 via the two module terminals 5 and 6, can be subjected to load modulation. Such a step is known per se. In this respect reference is made, for example, to the patent documents U.S. Pat. No. 5,345,231 A and EP 0 845 751 A1. Both patent documents contain a detailed description of load modulation means of a data carrier, also referred to as a transponder, so that these means will not be elaborated upon herein.

The test device 1 includes control means 11 which may be constructed, for example by means of a microcomputer but may also be realized, for example by means of analog electronic control circuitry. The control means 11 perform a series of control tasks which, however, will not be elaborated upon herein. The control means 11 also serve inter alia for activating two test operations of the test device 1. To this end the control means 11 are arranged to generate and output two test operation activation signals SET1 and SET2. The first test operation activation signal SET1 is capable of activating a test operation for determining the value of the input capacitance of a module 2 to be tested. The second test operation activation signal SET2 is capable of determining the modulation index which is caused by the load modulation of a test signal TS, output by the test device 1, by means of the load modulation means of a module 2 to be tested, and of determining correct data transmission to a module 2 to be tested and from a module 2 to be tested.

The test device 1 includes two test terminals, that is to say a first test terminal 12 and a second test terminal 13. Each of the two test terminals 12 and 13 can be brought into contact with a respective module terminal 5 and 6 of a module 2 to be tested as is indicated in FIG. 1 by means of diagrammatically shown test probes.

The test device 1 also includes a carrier signal generator 14 whereby a carrier signal CS in the form of a sine wave oscillation with a carrier signal frequency f0 can be generated. Such a carrier signal generator 14 includes, for example a PLL circuit which is used to stabilize and control the operating frequency of the carrier signal generator 14 so that the carrier signal frequency f0 of the carrier signal CS, corresponding to the operating frequency, can be stabilized and controlled.

The test device 1 also includes a data signal generator 15 which is capable of generating a data signal DS which consists of signal segments which represent a respective "0" bit and signal segments which represent a respective "1" bit. The data signal generator 15 is also arranged to output a data signal DS which has a constant DC voltage level of the value V1. The data signal generator 15 includes two control inputs 16 and 17; the control means 11 can supply the first control input 16 with the first test operation activation signal SET1 and the second control signal input 17 with the second test operation activation signal SET2.

The test device 1 also includes a first DC voltage generator 18 and a second DC voltage generator 19. The first data voltage generator 18 serves to generate and output a DC voltage VHI which lies in a normalized amplitude range. The second DC voltage generator 19 is arranged to generate and output a DC voltage VLO which also lies in a normalized amplitude range.

The two DC voltage generators 18 and 19 are succeeded by an analog switch 20 which can be supplied, via a first input 21, with the comparatively high DC voltage VHI and, via a second input 22, with the comparatively low DC voltage VLO. The analog switch 20 also includes a control input 23 via which the analog switch 20 can be supplied with the data signal DS. The analog switch 20 is constructed in such a manner that it forwards the comparatively high DC voltage VHI, applied to its first input 21, to its output 24 if the data signal DS applied to the control input 23 has a high level, and that it forwards the comparatively low DC voltage VLO, applied to its second input 22, to its output 24 if the data signal DS applied to the control input 23 has a low level. The analog switch 20 outputs a control signal SS via its output 24.

The test device 1 also includes a multiplier 25 which can be supplied, via a first input 26, with the carrier signal CS output by the carrier signal generator 14 and, via a second input 27, with the control signal SS output by the analog switch 20. The multiplier 25 provides multiplication of the signals received and outputs a multiplier signal MS via its output. The multiplier signal MS can be applied to an input of an amplifier 28 which provides amplification of the multiplier signal MS and can output an amplifier signal AS via its output 29.

To the output 29 of the amplifier 28 there is connected a first resistor terminal 30 of an ohmic series resistor 31 whose second resistor terminal 32 is connected to the first test terminal 12 of the test device 1. A test signal TS, corresponding to the amplifier signal AS, can be applied to the first test terminal 12 via the series resistor 31.

The test device 1 thus includes a signal path 33 which extends between the carrier signal generator 14 and the first test terminal 12 and includes the multiplier 25, the amplifier 28 and the series resistor 31, and via which a test signal TS, corresponding to the carrier signal CS output by the carrier signal generator 14, can be applied to the first test terminal 12; the load modulation means included in the integrated component of a module 2 to be tested are then capable of load modulating the test signal TS when the test terminals 12 and 13 are in contact with the module terminals 5 and 6 of the module 2.

As is shown in the Figure, in the test device 1 of FIG. 1 the signal path 33 is constructed so as to be conductive and a series resistor 31 is included in the signal path 33 as an impedance connected directly ahead of the first test terminal 12. Providing an ohmic series resistor 31 as an impedance has proven to be the most attractive and economical solution in practice. However, it is to be noted that practical tests using a capacitor as the impedance have also offered suitable results. In addition to a capacitor, a coil (inductance) may also be provided as an impedance.

In the test device 1 preferably two detection devices 34 and 35 are also connected to a test terminal, i.e. to the first test terminal 12; these detection devices are arranged to determine, while utilizing the test signal TS that can be applied to the first test terminal 12, a respective analog characteristic value C or m of a module 2 to be tested whose module terminals 5 and 6 are in contact with the test terminals 12 and 13. The test device 1 is also provided with a third detection device 36 which is connected to the first test terminal 12 and is arranged to detect, while utilizing the test signal TS that can be applied to the first test terminal 12, the correct digital functionality of a module 2 to be tested which is in contact with the test terminals 12 and 13 by way of its module terminals 5 and 6.

The first detection device 34 is arranged to determine the value C of the input capacitance present between the module terminals 5 and 6 of a module 2 to be tested. The first detection device 34 includes a first signal input 37, a second signal input 38 and a control input 39. The control means 11 can supply the control input 39 with the first test operation activation signal SET1 in order to activate the first detection device 34 upon execution of the first test operation.

The first signal input 37 of the first detection device 34 is connected to the first resistor terminal 30 of the series resistor 31 which is remote from the first test terminal 12. The second signal input 38 of the first detection device 34 is connected to the second resistor terminal 32 of the series resistor 31 which is connected to the first test terminal 12. It is thus achieved that the signals AS and TS, occurring on the two resistor terminals 30 and 32, respectively, of the series resistor 31, can be applied to the detection device 34.

The first detection device 34 is arranged to determine the value C of the input capacitance by means of the two signals AS and TS which occur on the two resistor terminals 30 and 32 of the series resistor 31 and are applied to the first detection device 34. To this end, the first detection device 34 includes a first operational amplifier 40 which succeeds the first signal input 37 and a second operational amplifier 41 which succeeds the second signal input 38. The two operational amplifiers 40 and 41 serve to buffer the level of the two signals AS and TS. The first operational amplifier 40 is succeeded by a first peak value rectifier 42. The second operational amplifier 41 is succeeded by a second peak value rectifier 43. The two peak value rectifiers 42 and 43 serve to rectify the signals output by the two operational amplifiers 40 and 41. The first peak value rectifier 42 outputs a first direct voltage DC1. The second peak value rectifier 43 outputs a second direct voltage DC2. The first direct voltage DC1 can be applied to a first analog-to-digital converter 44 and the second direct voltage DC2 can be applied to a second analog-to-digital converter 45. The two analog-to-digital converters 44 and 45 provide analog-to-digital conversion of the direct voltages DC1 and DC2 and thus output a respective digital value DV1 and DV2, respectively, to an arithmetic unit 46 of the first detection device 34. The arithmetic unit 46 is arranged to calculate the input capacitance C on the basis of the digital values DV1 and DV2 received. First indicator means 47 which are capable of indicating the value of the determined input capacitance C are connected to the arithmetic unit 46 of the first detection device 34. To the arithmetic unit 46 there may also be connected other means, for example alarm signal generating means which output an alarm signal upon detection of a value of the input capacitance C which lies outside a predetermined range, or module rejection means which ensure that the tested module 2 is rejected in the case of a negative test result.

The second detection device 35 is arranged to determine the value m of the modulation index of a module 2 to be tested which is caused by the load demodulation means and occurs between the module terminals 5 and 6 of such a module. The second detection device 35 includes a signal input 48 and a control input 49. The control means 11 can supply the control input 49 with the second test operation activation signal SET2 in order to activate the second detection device 35 for a second test operation.

From the first test terminal 12 the signal input 48 of the second detection device 35 can receive a test signal TSB which is load modulated by means of the load modulation means of a module 2 to be tested. In conformity with the load modulation, the load modulated test signal TSB has two different signal levels. As will be described in detail hereinafter, the second detection device 35 is arranged to determine the modulation index m on the basis of these two signal levels occurring in the load modulated test signal TSB.

Connected to the second detection device 35 are second indicator means 50 which are arranged to indicate the value m of the determined modulation index. In addition to the second indicator means 50, other means, for example alarm signal generating means and module rejection means, can also be connected to the second detection device 35.

The third detection device 36 is arranged to determine correct digital operation of a module 2 to be tested. In other words, the third detection device 36 is capable of determining whether a module 2 to be tested correctly recognizes data applied thereto and executes correct output of data after the recognition of such received data.

The third detection device 36 includes a signal input 51 and a control input 52. The control means 11 can supply the control input 52 with the second test operation activation signal SET2 in order to activate, in addition to the second detection device 35, also the third detection device 36 for a second test operation. The signal input 51 of the third detection device 36 can receive the load modulated test signal TSB, like the signal input 48 of the second detection device 35.

The third detection device 36 includes demodulation means 53 which can be supplied with the test signal TSB which is applied to the signal input 51 of the third detection device 36 and is load modulated in conformity with a Manchester code, said demodulation means providing demodulation of the load modulated test signal TSB. The demodulation means 53 can output a demodulated data signal DDS via an output 54; this signal can be applied to an input 55 of test means 56 of the third detection device 36. The test means 56 are arranged to test the demodulated data signal DDS applied thereto.

The test means 56 can be supplied, for example by the data signal generator 15, with a given request data signal DS, that is to say a data block which has a given bit pattern and is responsible for outputting a given response data signal in a module 2 to be tested, so that load modulation of the test signal TS must take place in conformity with said given response data signal and, in the case of correct digital operation of the module 2 to be tested, a load modulated test signal TSB exhibiting a given load modulation pattern is thus applied to the third detection device 36, said load modulated carrier signal yielding, after its demodulation by means of the demodulation means 53, a given demodulated data signal DDS. The test means 56 then test whether the demodulated data signal DDS corresponds to the expected reference data signal which corresponds to the request data signal DS applied to the test means by the data signal generator 15.

When the test means 56 have detected a correct demodulated data signal DDS, and hence correct digital functionality of a module 2 to be tested, this positive test result can be indicated via third indicator means 57 which are connected to the test means 56.

The operation of the test device 1 during the execution of two test operations will be described in detail hereinafter.

In order to initiate a first test operation for determining the value C of the input capacitance of a module 2 to be tested, the test device 1 is activated, for example, manually or automatically. Subsequently, the control means 11 output the first test operation activation signal SET1, i.e. to the data signal generator 15 and to the first detection device 34; this causes the appearance of the signals shown in the FIGS. 2A to 2G in the test device 1 as will be described hereinafter.

Figure 2A:
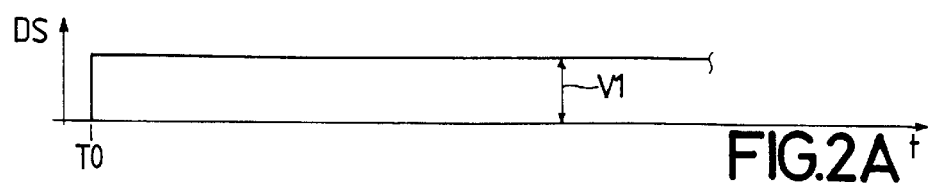
Figure 2B:
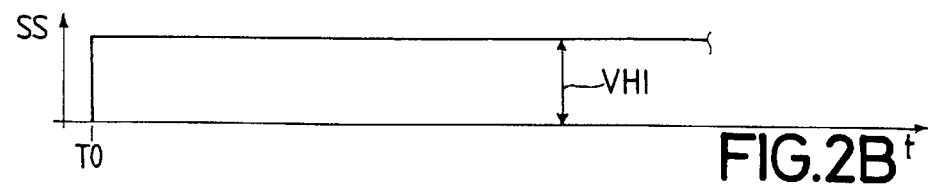
Figure 2C:
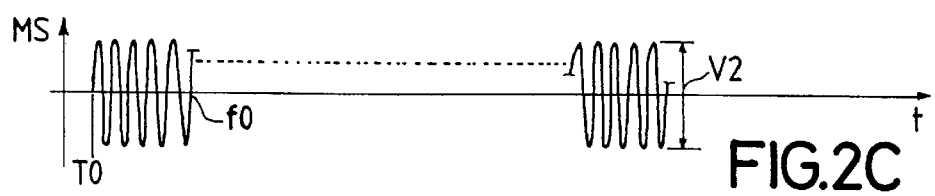
Figure 2D:
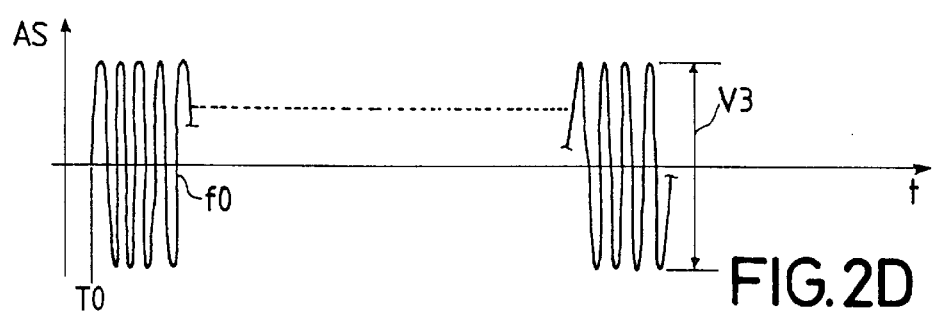
Figure 2E:
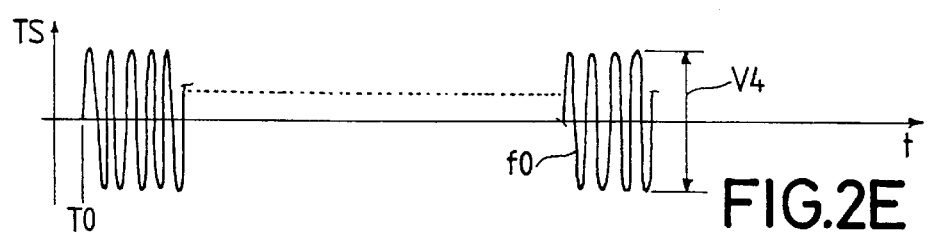
Figure 2F:
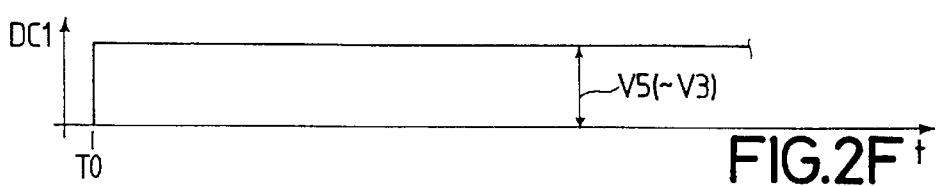
Figure 2G:
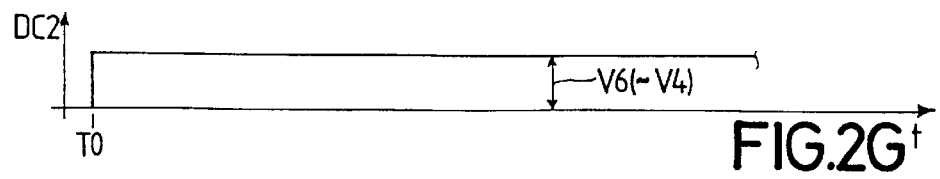

After reception of the first test operation activation signal SET1, the data signal generator 15 outputs the data signal DS which is shown in FIG. 2A and is formed by a direct voltage having the value V1. This data signal DS is applied to the analog switch 20, with the result that the analog switch 20 outputs the control signal SS which is shown in FIG. 2B and is formed by the higher direct voltage VHI. The control signal SS shown in FIG. 2B is applied to the multiplier 25 which also receives the carrier signal CS output by the carrier signal generator 14, with the result that the multiplier outputs the multiplier signal MS of FIG. 2C via its output 26. This multiplier signal MS has a peak-to-peak amplitude of the value V2. The multiplier signal MS is amplified by the amplifier 28, so that the amplifier signal AS shown in FIG. 2D appears at the output 29 of the amplifier 28, and hence at the first resistor terminal 30 of the series resistor 31; this amplifier signal has a peak-to-peak amplitude of the value V3. The amplifier signal AS shown in FIG. 2D is subjected to voltage division by means of the ohmic/capacitive voltage divider formed by the series resistor 31 and the input capacitance of the module 2 to be tested, with the result that the test signal TS obtained by voltage division appears on the second resistor terminal 32 of the series resistor 31, said test signal having a peak-to-peak amplitude of the value V4.

The amplifier signal AS appearing on the first resistor terminal 30 is applied to the first signal input 37 of the first detection device 34 which is activated by the first test operation activation signal SET1. The test signal TS appearing on the second resistor terminal 32 is applied to the second signal input 38 of the first detection device 34. Consequently, the direct voltage DC1 shown in FIG. 2F appears on the output of the first peak value rectifier 42 and the direct voltage DC2 shown in FIG. 2D appears on the output of the second peak value rectifier 43. The direct voltage DC1 then has a value V5 which corresponds to the peak-to-peak amplitude V3 of the amplifier signal AS. The direct voltage DC2 then has a value V6 which corresponds to the peak-to-peak amplitude V4 of the test signal TS. Subsequently, the two values V5 and V6 are subjected to analog-to-digital conversion, after which the digital values DV1 and DV2 thus obtained are applied to the arithmetic unit 46 so that the arithmetic unit 46 can calculate the value of the input capacitance C, after which this value C is indicated by means of the first indicator means 47.

In order to initiate a second test operation, the control means 11 output the second test operation activation signal SET2, that is to say to the data signal generator 15 and to the second detection device 35 as well as to the third detection device 36. In response thereto the signals shown in the FIGS. 3A to 3F occur in the test device 1 as will be described in detail hereinafter.

Figure 3A:
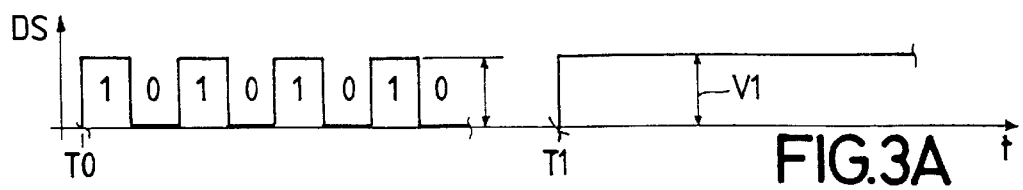
Figure 3B:
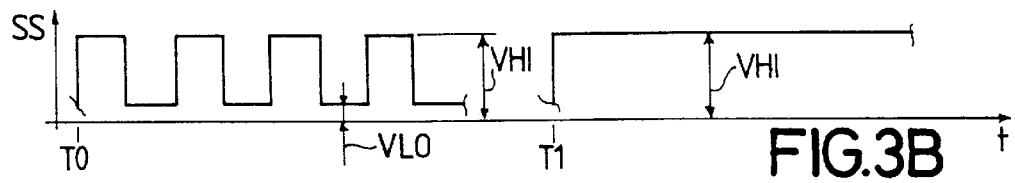
Figure 3C:
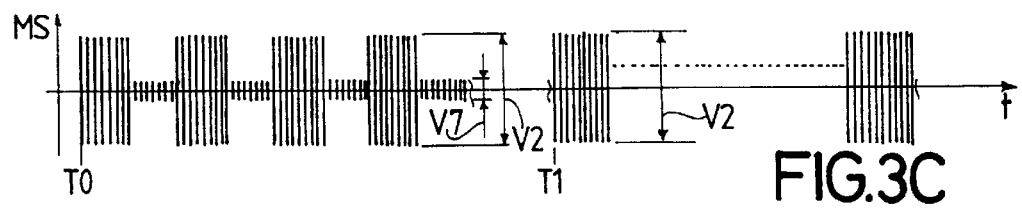

After the reception of the second test operation activation signal SET2, the data signal generator 15 outputs the data signal DS which is shown in the left-hand part of FIG. 3A, commences at the instant T0 and in this case consists of an invariable succession of "1" bits and "0" bits. The data signal DS constitutes a request data signal whereby the module 2 to be tested is requested to output a very well defined response data signal. The request data signal is applied to the control input 23 of the analog switch 20, with the result that the output 24 of the analog switch 20 outputs the control signal SS which is shown in the left-hand part of FIG. 3B and whose amplitude alternates between the values VHI and VLO. The control signal SS is applied to the multiplier 25 which also receives the carrier signal CS, with the result that the output 26 of the multiplier 25 outputs the multiplier signal MS which is shown in the left-hand part of FIG. 3C. As a result of the multiplier signal MS, the amplifier signal AS which is shown in the left-hand part of FIG. 3D appears on the first resistor terminal 30 of the series resistor 31 and the test signal TS which is shown in the left-hand part of FIG. 3E appears on the second resistor terminal 32 of the series resistor 31. In respect of the multiplier signal MS it is also to be noted that this signal alternates between the peak-to-peak amplitudes V2 and V7. The amplifier signal AS alternates between the peak-to-peak amplitudes V3 and V8. The test signal TS alternates between the peak-to-peak amplitudes V4 and V9.

Figure 3D:
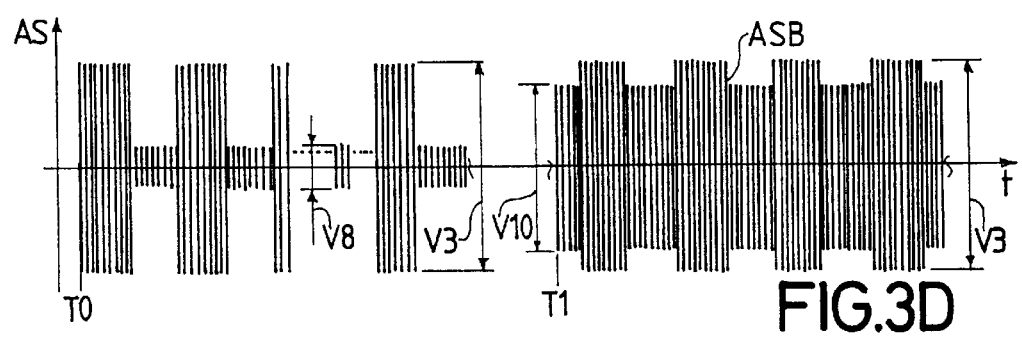
Figure 3E:
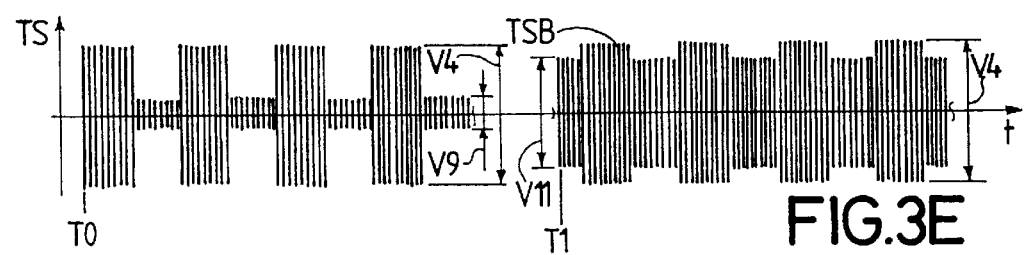

The test signal TS which is shown in the left-hand part of FIG. 3E is applied to the module 2 to be tested and causes the module 2 to output the given response data signal, so a response data signal which corresponds to a predetermined data sequence or to a predetermined data block. The module 2 to be tested, or its integrated component 4, then performs load modulation, using the load modulation means included therein, of a test signal, applied to its module terminals 5 and 6, in conformity with the given response data signal.

To this end, during the second test operation the data signal generator 15 outputs, as from an instant T1, the data signal DS which is shown in the right-hand part of FIG. 3A and again consists of a direct voltage of the value V1. As a result, the output 24 of the analog switch 20 outputs the control signal SS which is shown in the right-hand part of FIG. 3B and has a constant value VHI. As a result, the output of the multiplier 25 outputs the multiplier signal MS which is shown in the right-hand part of FIG. 3C and has a peak-to-peak amplitude V2. The multiplier signal MS is amplified by means of the amplifier means 28 so that an amplifier signal AS and a test signal TS are obtained once more.

As appears from the right-hand part of FIG. 3D and FIG. 3E, the amplifier signal AS and the test signal TS are no longer non-modulated but load modulated by way of the load modulation by means of the load modulation means of the module to be tested, so that the amplifier signal appearing on the first resistor terminal 30 is a load modulated amplifier signal ASB and the test signal appearing on the second resistor terminal 32 is a load modulated test signal TSB. Because of the load modulation, the peak-to-peak amplitude of the load modulated-amplifier signal ASB alternates between the value V3 and a value V10 and the amplitude of the load modulated test signal TSB alternates between the value V4 and a value V11.

The load modulated test signal TSB which is shown in the right-hand part of FIG. 3E is applied to the second detection device 35 as well as to the third detection device 36 in the test device 1.

On the basis of the two peak-to-peak values V4 and V11, the second detection device 35 determines the modulation index, after which the value m of the modulation index is indicated by means of the second indicator means 50.

Figure 3F:
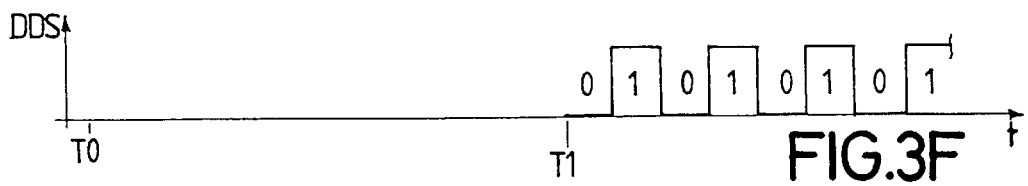

In the third detection device 36 the received load modulated test signal TSB is demodulated by means of the demodulation means 53, after which the demodulated data signal DDS shown in FIG. 3F is obtained. The demodulated data signal DDS is applied to the test means 56 and tested for correctness. When the test means 56 detect a correctly demodulated data signal DDS, the positive test result is indicated by means of the third indicator means 57.

In the case described above with reference to FIG. 3A the data signal generator 15 outputs the data signal DS in which a "1" bit is represented by a first signal segment having a given signal duration and a high amplitude, a "0" bit being represented by a second signal segment which has the same signal duration but a lower amplitude, the first and the second signal segments therein succeeding one another directly. However, it is alternatively possible for the data signal generator 15 to output a data signal DS in which a "1" bit is represented by a first signal segment of a given first signal duration and a given amplitude and a "0" bit is represented by a second signal segment which has a different, for example shorter, duration in comparison with the first signal duration and the same amplitude, and in which the first and second signal segments are separated from one another by pause segments of constant length.

In the described test device it is simply achieved that two important analog characteristic values of a module 2 to be tested can be determined, that is to say the value C of the input capacitance of such a module 2 and the value m of the modulation index of such a module 2. Additionally, the digital functionality of such a module 2 can also be simply verified by means of the test device 1.

The invention is not restricted to the described embodiment. A test device may also be constructed by means of other components. Furthermore, a test device may also include further detection devices.

What is claimed is:

1. A test device (1) which is arranged to carry out at least one test operation on a module (2) which is constructed for use in conjunction with a data carrier intended for contactless communication and includes an integrated component (4), two module terminals (5, 6) for connection to two transmission means terminals, and includes two test terminals (12, 13), each of which can be brought into contact with a module terminal (5, 6) of a module (2) to be tested, and includes a carrier signal generator (14) whereby a carrier signal (CS) can be generated, and includes a signal path (33) which is situated between the carrier signal generator (14) and at least one test terminal (12) and via which a test signal (TS), corresponding to a carrier signal (CS) output by the carrier signal generator (14), can be applied to the at least one test terminal (12), the load modulation means which are included in the integrated component (4) of the module (2) to be tested being capable of load modulating the test signal (TS) when module terminals (5, 6) of a module (2) to be tested are in contact with the test terminals (12, 13), characterized in that the signal path (33) is constructed so as to be conductive, that an impedance (31) is included in the signal path (33), directly ahead of the at least one test terminal (12), and that at least one detection device (34, 35) is connected to at least one test terminal (12), which detection device is arranged to determine, while utilizing the test signal (TS) that can be applied to the at least one test terminal (12), an analog characteristic value (C, m) of a module (2) to be tested which is in contact with the test terminals (12, 13) by way of its module terminals (5, 6).

2. A test device (1) as claimed in claim 1, characterized in that a detection device (34) is arranged to determine the value (C) of the input capacitance which is present between the module terminals (5, 6) of a module (2) to be tested.

3. A test device (1) as claimed in claim 2, characterized in that a first input (37) of the detection device (34) is connected to an impedance terminal (30) of the impedance (31) which is remote from a test terminal (12), that a second input (38) of the detection device (34) is connected to an impedance terminal (32) of the impedance (31) which is connected to the test terminal (12), so that the detection device (34) can be supplied with the signals (AS, TS) appearing on the two impedance terminals (30, 32) of the impedance (31), and that the detection device (34) is arranged to determine the value (C) of the input capacitance by means of the signals (AS, TS) which appear on the two impedance terminals (30, 32) of the impedance (31) and are applied to the detection device.

4. A test device (1) as claimed in claim 1, characterized in that a detection device (35) is arranged to determine the value (m) of the modulation index which is produced by the load modulation means of a module (2) to be tested and appears between the module terminals (5, 6) of such a module (2).

5. A test device (1) as claimed in claim 1, characterized in that an ohmic resistor is provided as the impedance (31).

6. A method of manufacturing a module (2) which is constructed for use in conjunction with a data carrier intended for contactless communication and includes an integrated component (4), two module terminals (5, 6) for connection to two transmission means terminals, the module (2) being subjected to a test operation by means of a test device (1) which includes two test terminals (12, 13), in which each module terminal (5, 6) of the module (2) is brought into contact with a test terminal (12, 13) of the test device (1), and in which a carrier signal (CS) is generated by means of a carrier signal generator (14) of the test device (1), and in which a test signal (TS) which corresponds to the carrier signal (CS) output by the carrier signal generator (14) is applied to the at least one test terminal (12) via a signal path (33) which is situated between the carrier signal generator (14) and at least one test terminal (12), and in which the test signal (TS) is load modulated by means of load modulation means included in the integrated component (4) of this module (2), when module terminals (5, 6) of the module (2) are in contact with the test terminals (12, 13), characterized in that the test signal (TS) corresponding to the carrier signal (CS) is applied to the at least one test terminal (12) via a signal path (33) which is constructed so as to be conductive and includes an impedance (31) connected directly ahead of the at least one test terminal (12), and that, utilizing at least one detection device (34, 35), connected at least to one test terminal (12), of the test device (1), an analog characteristic value (C, m) of the module (2) which is in contact with the test terminals (12, 13) by way of its module terminals (5, 6) is detected while utilizing the test signal (TS) that can be applied to the at least one test terminal (12).

7. A method as claimed in claim 6, characterized in that the value (C) of the input capacitance which is present between the module terminals (5, 6) of the module (2) is determined by means of a detection device (34).

8. A method as claimed in claim 7, characterized in that a first input (37) of the detection device (34) is supplied with a signal (AS) which appears on the impedance terminal (30) of the impedance (31) which is remote from the test terminal (12), and that a second input (38) of the detection device (34) is supplied with a signal (TS) which appears on the impedance terminal (32) of the impedance (31) which is connected to the test terminal (12), and that the value (C) of the input capacitance is determined by means of the detection device (34) while utilizing the signals (AS, TS) which appear on the two impedance terminals (30, 32) of the impedance (31) and are applied to the detection device (34).

9. A method as claimed in claim 6, characterized in that the value (m) of the modulation index which is produced by the load modulation means of the module (2) and appears between the module terminals (5, 6) of the module (2) is determined by means of a detection device (35).

10. A method as claimed in claim 6, characterized in that the test signal (TS) corresponding to the carrier signal (CS) is applied to the at least one test terminal (12) via a signal path (33) which includes an impedance (31) in the form of an ohmic resistor.

11. A method of simultaneously testing a digital functionality and determining an analog characteristic value of a module intended for use in a data carrier having contactless communication capability, the module having two module terminals for connection to transmission terminals of the data carrier, comprising the steps of:

contacting the two module terminals to respective test terminals of a test device;

generating a carrier modulated test signal in the test device;

applying the carrier modulated test signal to at least one of the test terminals, the carrier modulated test signal testing a digital functionality of the module without contactlessly communicating the carrier modulation test signal to the module; and connecting a detection device to at least one of the test terminals for simultaneously measuring an analog characteristic of the module utilizing the same applied carrier modulated test signal.

12. The method of claim 11 wherein the detection device measures input capacitance of the module.

13. The method of claim 11 wherein the detection device measures a modulation index of the module.

* * * * *